United States Patent
Uehara

(10) Patent No.: US 7,564,532 B2
(45) Date of Patent: Jul. 21, 2009

(54) LIQUID CRYSTAL TELEVISION AND PANEL-TYPE DISPLAY DEVICE

(75) Inventor: Takuya Uehara, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 197 days.

(21) Appl. No.: 11/805,504

(22) Filed: May 23, 2007

(65) Prior Publication Data

US 2007/0273284 A1 Nov. 29, 2007

(30) Foreign Application Priority Data

May 25, 2006 (JP) .............................. 2006-145539

(51) Int. Cl.
*G02F 1/1345* (2006.01)
(52) U.S. Cl. ........................ 349/149; 349/150; 349/152; 313/582; 362/615
(58) Field of Classification Search ................ 349/149, 349/150, 152; 313/582; 362/615
See application file for complete search history.

(56) References Cited

U.S. PATENT DOCUMENTS

| 4,219,928 | A | | 9/1980 | Kuo | |
|---|---|---|---|---|---|
| 4,806,922 | A | * | 2/1989 | McLaughlin et al. | .......... 349/73 |
| 4,959,887 | A | * | 10/1990 | Gruenberg et al. | ............ 16/223 |
| 6,160,605 | A | * | 12/2000 | Murayama et al. | .......... 349/152 |
| 7,187,427 | B2 | * | 3/2007 | Ide et al. | ...................... 349/150 |
| 2005/0097583 | A1 | * | 5/2005 | Okumura | .................... 720/652 |
| 2006/0023153 | A1 | | 2/2006 | Taguchi | |
| 2007/0230132 | A1 | * | 10/2007 | Lee | ............................ 361/707 |
| 2008/0122736 | A1 | * | 5/2008 | Ronzani et al. | ................ 345/8 |

FOREIGN PATENT DOCUMENTS

| EP | 1336974 | 8/2003 |
|---|---|---|
| JP | 2000-172192 | 6/2000 |

OTHER PUBLICATIONS

The European search report, pursuant to Rule 44a EPC dated Aug. 17, 2007, searched on Aug. 8, 2007.

* cited by examiner

*Primary Examiner*—Ellen Kim
(74) *Attorney, Agent, or Firm*—Yokoi & Co., U.S.A., Inc.; Peter Ganjian

(57) ABSTRACT

When a control substrate 23 installed on a rear face 26 of a liquid crystal module 20 is to be connected through flat cables 30 to two drive circuit substrates 24a, 24b installed on right and left areas of an upper side surface 25 of the liquid crystal module 20, each of the flat cables 30 connecting the first and second substrates is bent in such a manner that cable surface regions thereof are overlapped with each other in the middle of the flat cable, thereby cause an extension direction of the flat cable to be shifted parallel or is bent at right angles in the middle of the flat cable.

7 Claims, 4 Drawing Sheets

PRIOR ART

LIQUID CRYSTAL TELEVISION AND PANEL-TYPE DISPLAY DEVICE

CROSS-REFERENCES TO RELATED APPLICATIONS

The present application is related to the Japanese Patent Application No. 2006-145539, filed May 25, 2006, the entire disclosure of which is expressly incorporated by reference herein.

BACKGROUND OF THE INVENTION (1) Field of the Invention

This present invention relates to a connection structure between substrates carried on a panel-type display device.

(2) Description of Related Art

FIG. 4 illustrates a conventional connection structure between substrates.

In the example shown in the same Figure, connectors 3 with which a substrate 1 is provided, and connectors 4 with which a substrate 2 is provided, are connected by belt-shaped cables (flat cables) 5, whereby the substrate 1 and the substrate 2 are connected to each other so as to be capable of carrying out a data-transmit. Both the substrate 1 and the substrate 2 are substrates which are carried on a single liquid crystal module. The substrate 1 has a control circuit (not shown) mounted thereon for carrying out demodulation of an image signal, and the like. The substrate 2 has a drive circuit (not shown) mounted thereon for driving a liquid crystal panel on the basis of the image signal produced in the substrate 1.

Also, Japanese Patent Application Laid-Open No. 2000-172192 discloses a liquid crystal display device in which a first substrate having a display area and a driver circuit, and a second substrate having a control circuit are connected by a flexible cable.

In the case where the substrates are connected by the flat cables 5 as shown in FIG. 4, the flat cables 5 which are straightly led out from the connectors of one of the substrates are connected to the connectors of the other of the substrates.

That is, hitherto, when two connectors are to be connected by a single flat cable, if the flat cable is led out from one of the connectors so as to extend along a surface of a liquid crystal module, it is necessary to cause the other of the connectors to be located on an elongation line of the led-out flat cable.

However, such a connection structure has the problems of considerably hampering the miniaturization of the substrates and considerably reducing the degree of freedom in layout of the substrates. From a viewpoint of, for example, reduction in the production cost of the substrates if the substrate 1 is miniaturized as shown by a chain line in FIG. 4 or the installation location of the substrate 1 is changed as shown by a chain double-dashed line in FIG. 4, the connectors 3 of the substrate 1 and the connectors 4 of the substrate 2 are positionally shifted relative to one another. Consequently, the connection between the substrate 1 and the substrate 2 can not be made by the flat cables 5. Eventually, it is hard to cause the substrate 1 to be miniaturized and cause the location of the substrate 1 to be changed. Moreover, if the substrate 1 is miniaturized or the location of the substrate 1 is changed, in order to avoid the positional deviation between the connectors 3 and the connectors 4, which is brought about by the miniaturization of the substrate and the changing of the location, it is necessary to cause the substrate 2 to be large-sized or cause the location of the substrate 2 or the locations of the connectors 4 of the substrate 2 to be changed.

The situation in which the substrate can not be miniaturized or the situation in which the degree of freedom in the layout of the substrates is low will contribute to increase in the production cost of the liquid crystal module. Moreover, the large-sization and change in the location of the substrate other than the substrate which has been miniaturized or whose layout has been changed, will also contribute to increase in the production cost of the liquid crystal module.

Moreover, in the structure disclosed in Japanese Patent Application Laid-Open No. 2000-172192, connection between the members are made merely by the flexible cable which is straightly led out from its attaching locations with respect to the respective members as shown in FIG. 6 of the same application, so that the above-mentioned problems have remained unsettled.

BRIEF SUMMARY OF THE INVENTION

The present invention discloses a connection structure between substrates carried on a panel-type display device, in which the miniaturization of the substrates and flexible change in the installation locations of the substrate are realized, thus making it possible to reduce the production cost of the panel-type display device.

According to the present invention, in a panel-type display device in which a first substrate installed on a rear face of a device body having a display panel provided at a front face thereof, and second substrates installed on predetermined locations of the device body are connected by flat cables, first cable connecting sections provided at the first substrate and second cable connecting sections provided at the second substrates are connected. The second cable connecting sections are provided at locations shifting from elongation lines of cables led out from the first cable connecting sections so as to extend along a surface of the device body. The flat cables are bent such that cable surface regions thereof are overlapped with each other in the middles of the flat cables, whereby the connection between the above-mentioned substrates is made.

That is, according to the present invention, when the two substrates are to be connected to each other by the flat cables, the flat cables are bent in such a manner that cable surface regions are overlapped with one another in the middles of the flat cables. Thereby, the first and second cable connecting sections which are not opposed to each other on an elongation line of a counter cable connecting section along a surface of a panel-type display device can be connected to each other by a single flat cable. Therefore, locations of the cable connecting sections with respect to the substrates to be connected to each other become unfixed. As a result, the miniaturization of the substrate and change in the location of the substrate are made possible and, therefore, the production cost of the panel-type display device is reduced.

Various modes for connection between the substrates by the flat cables are possible. As one example of the connection modes, in a case where the flat cables are led out from the first cable connecting sections and the second cable connecting sections so as to extend along the surface of the device body, the first cable connecting sections and the second cable connecting sections are provided so as to allow the flat cables to be substantially parallel to one another. In this case, the flat cables may be bent at two portions thereof in the middles of the flat cables and the substrates are connected to each other by the bent flat cables. That is, in a case where the first cable connecting sections and the second cable connecting sections are opposed to one another but directions in which they are directed to one another are shifted so as to be parallel to one another, the flat cables are bent at the two portions thereof in the middles of the flat cables, and the substrates are connected to each other by the bent flat cables. Consequently, it is possible to realize suitable miniaturization of the respective substrates and change in the locations of the respective substrates, in the condition where the positional shift between the first cable connecting sections and the second cable connecting sections is allowed. Moreover, in order to avoid the above-mentioned positional shift, it is unnecessary to purposely cause the substrates to be large-sized.

As another example of the connection modes by the flat cables, in a case where the flat cables are led out from the first cable connecting sections and the second cable connecting sections so as to extend along the surface of the device body, the first cable connecting sections and the second cable connecting sections are provided so as to allow the flat cables to cross at substantially right angles, the flat cables may be each bent at substantially right angles at a portion thereof in the middle of the flat cable, and the substrates are connected to each other by the bent flat cables. That is, in a case where the first connecting sections and the second connecting sections are directed toward directions different from each other at about 90 degrees, the flat cables are each bent at the substantially right angles at the portion of the middle of the flat cable and the substrates are connected to each other by the bent flat cables. Consequently, it is possible to realize suitable miniaturization of the respective substrates and change in the locations of the respective substrates while allowing the orientation of the first connecting sections and the orientation of the second connecting sections to remain different from one another. Moreover, in order to solve the difference in the above-mentioned orientations, it is unnecessary to carry out the changing of the locations of the substrates and the changing of the locations of the cable connecting sections.

While the first substrate is installed on the rear face of the device body as discussed above, the second substrates may be installed on one of side surfaces interconnecting the front and rear faces of the device body so as to be respectively arranged on both sides of the side surface which interpose a substantially center area of the side surface therebetween. In the case where such a location relation between the first substrate and the second two substrates is taken, in the conventional cable connection structure, it is necessary to cause the first substrate to be arranged in such a manner that the first cable connecting sections are located on elongation lines from the second cable connecting sections of the second two substrates, so that the substrates are required to be large-sized and the installation locations of the substrates are considerably limited. However, in the case where the present invention is employed, the location relationships between the first cable connecting sections and the second cable connecting sections are considerably free. Thus, even if the above-mentioned location relationships between the first substrate and the second substrates are taken, it is possible to flexibly realize the miniaturization of the first substrate and the change in the installation location of the first substrate. Moreover, the unnecessary large-sization of the second two substrates is not required.

As a concrete embodiment of the present invention which takes into account the above-mentioned respective constructions, there is provided a liquid crystal television which comprises a liquid crystal module having a front face, a rear face and side surfaces interconnecting the front face and the rear face, and a television cabinet having the liquid crystal module housed therein, the liquid crystal module comprising a device including a liquid crystal panel whose screen size is larger than 27 inch, and a backlight unit installed on a rear face of the liquid crystal panel, the liquid crystal panel having a plurality of vertically facing signal electrodes provided therein, a control substrate installed on a rear face of the backlight unit for demodulating an image signal on the basis of a television broadcast signal, producing an RGB signal per pixel of the liquid crystal television on the basis of the demodulated image signal, and carrying out control of the supply of power, two drive circuit substrates installed at predetermined positions of the device for receiving the RGB signal and the supply of power from the control substrate, to thereby drive the plurality of vertically facing signal electrodes, first four connectors mounted to the control substrate, second four connectors mounted to the drive circuit substrates, and flat cables connecting the first connectors and the second connectors, wherein the control substrate is arranged in the vicinity of a long side of an upper side surface of the side surfaces of the liquid crystal module with a substantially center of the control substrate being located on a vertical center-line of the liquid crystal module, the first four connectors are mounted to the control substrate in a condition where they are all directed toward the long side and two of the first four connectors are arranged at each of left and right sides interposing the vertical center-line, two of the second four connectors are mounted to each of the drive circuit substrates in a condition where they are all directed toward the rear face of the liquid crystal module, the two drive circuit substrates are respectively arranged on left and right areas of the upper side surface so as to interpose the vertical center-line therebetween, two inner connectors of the second four connectors which interpose the vertical center-line are mounted to the drive circuit substrates in a condition where an interval between the two inner connectors becomes longer than an interval between two inner connectors of the first four connectors, two outer connectors of the second four connectors are mounted to the drive circuit substrates in a condition where an interval between the two outer connectors becomes longer than an interval between two outer connectors of the first four connectors, connection between connectors of the first connectors and connectors of the second connectors which are located on a right side of the vertical center-line is made by flat cables which are led out from the first connectors on the right side, and firstly bent to the right side one time in such a manner that cable surface regions thereof are overlapped with each other and further bent upward one time in such a manner that cable surfaces thereof are overlapped with each other at predetermined regions of the firstly bent cable portions, connection between connectors of the first connectors and connectors of the second connectors which are located on a left side of the vertical center-line is made by flat cables which are led out from the first connectors located on the left side, and firstly bent to the left side one time in such a manner that cable surface regions thereof are overlapped with each other, and further bent upward one time in such a manner that cable surfaces thereof are overlapped with each other at predetermined regions of the firstly bent cable portions of the flat cables led out from the first connectors located on the left side, two flat cables connecting the first inner connectors and the second inner connectors are adapted to be used for supplying the RGB signal to each of the drive circuit substrates from the control substrate, and two flat cables connecting the first outer connectors and the second outer connectors are adapted to be used for supplying power to each of the drive circuit substrates from the control substrate.

That is, in a concrete product such as the liquid crystal television, the same operation as the respective panel-type display devices perform and the same effect as the panel-type display devices take are done.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character (s) present corresponding parts throughout.

DETAILED DESCRIPTION OF THE INVENTION

The detailed description set forth below in connection with the appended drawings is intended as a description of presently preferred embodiments of the invention and is not intended to represent the only forms in which the present invention may be constructed and or utilized.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. For example, Such variations and alternate embodiments are contemplated, and can be made without departing from the spirit and scope of the invention.

Embodiments according to the present invention will be discussed hereinafter with reference to the respective drawings.

Figure 1:
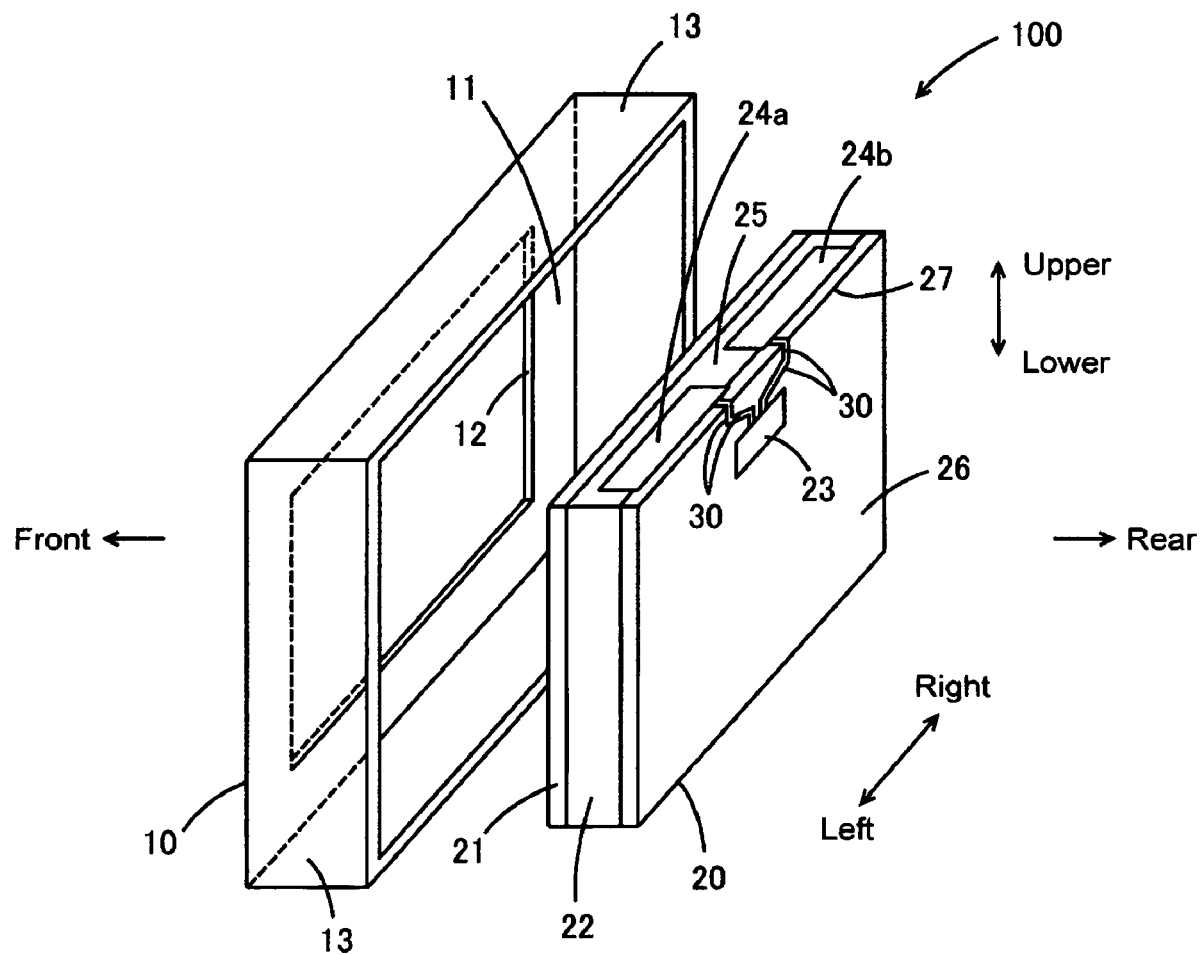
FIG. 1 is an exemplary illustration of a schematic perspective view of a liquid crystal television, as viewed from the rear side.

FIG. 1 is a schematic perspective view illustrating respective components making up a liquid crystal television 100, as viewed from a rear side of the liquid crystal television 100. In the same Figure, a front cabinet 10 and a liquid crystal module 20 are shown. The front cabinet 10 is a part of a television cabinet made of a synthetic resin, and opened at a rear side thereof. The front cabinet 10 has an opening 12 formed in a substantially central portion of a front face 11 thereof for allowing a screen of the liquid crystal module 20 housed within an interior of a housing body to be exposed to the outside. Side surfaces 13 extend toward the rear side from upper, lower, left and right edge portions of the front face 11.

The liquid crystal module 20 generally includes a liquid crystal panel 21, a backlight unit 22 installed on a rear face of the liquid crystal panel 21, and various substrates. In the illustrated example, the liquid crystal module 20 is equipped with a control substrate 23 and two drive circuit substrates 24a, 24b. The control substrate 23 corresponds to a first substrate. The drive circuit substrates 24a, 24b correspond to second substrates. The liquid crystal panel 21 generally includes two glass substrates, and various electrodes and liquid crystal materials which are disposed between the glass substrates. In the liquid crystal panel 21, pixels are arranged in a matrix form. The backlight unit 22 is provided with backlights consisting of fluorescent tubes, invertors for driving the backlights, and the like.

The control substrate 23 has a control circuit mounted thereon for controlling an image-displaying operation carried out by the liquid crystal television 100. The control circuit is adapted to demodulate an image signal from a television broadcast signal received by a tuner and also adapted to carry out an image signal processing, in which an RGB signal is produced per pixel of the liquid crystal panel 21, on the basis of the demodulated image signal. Also, the control circuit is adapted to carry out a control processing in which power produced by a power source circuit is supplied to respective circuits of the liquid crystal television 100. The control substrate 23 is installed on a predetermined position of the rear face of the liquid crystal module 20 (a rear face of the backlight unit 22). The liquid crystal module 20 is a panel-type display device.

The drive circuit substrates 24a, 24b are substrates having drive circuits mounted thereon for receiving the above-mentioned RGB signal and the supply of the power from the control circuit, to thereby drive the liquid crystal panel 21. The liquid crystal panel 21 has a plurality of vertically (upper and lower directions) facing signal electrodes and a plurality of horizontally (left and right directions) facing scan electrodes. The drive circuit substrates 24a, 24b also have drive circuits mounted thereon for controlling the drive of the signal electrodes of which the drive circuit substrates respectively take charge. In this embodiment, the two drive circuit substrates 24a, 24b are installed on an upward facing side surface 25 of upper, lower, left and right side surfaces interconnecting the front and rear faces of the liquid crystal module 20. The structure in which the two drive circuits for driving the signal electrodes are employed in this manner is basically applied to a model whose screen size is larger than a given size. In this embodiment, the liquid crystal panel 21 of the liquid crystal module 20 is a large-sized model whose screen size is larger than 27 inch.

In the embodiment constructed as discussed above, the control substrate 23 and the two drive circuit substrates 24a, 24b are connected to one another by flat cables 30. Incidentally, in an assembly of the liquid crystal television 100, an unshown rear cabinet for covering the rear side of the liquid crystal module 20 is employed, and the front cabinet 10 and the rear cabinet constitute the single television cabinet. In an interior of the television cabinet, unshown various components required for realizing the liquid crystal television 100, such as the above-mentioned tuner, the power supply circuit and the like, are housed in addition to the liquid crystal module 20.

Figure 2:
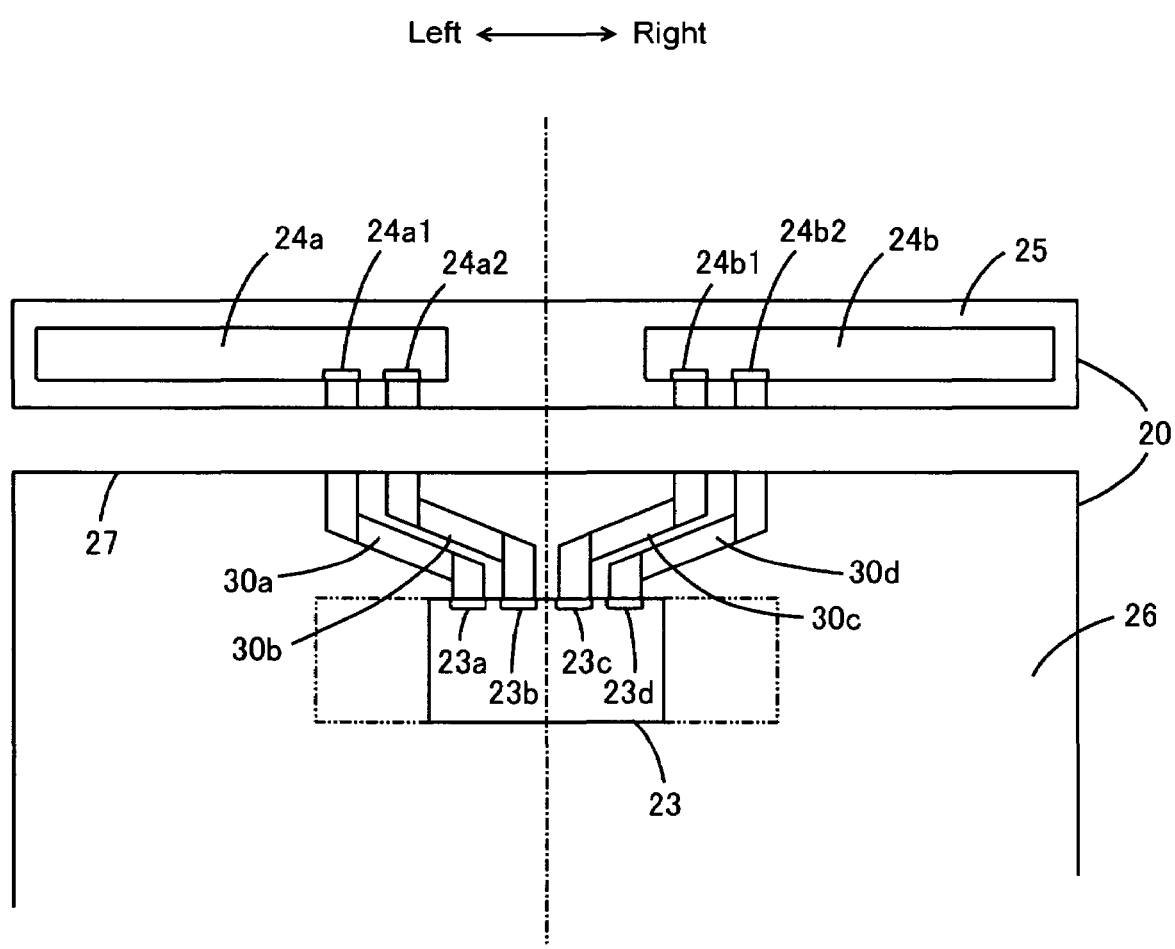
FIG. 2 is a schematic view illustrating one example of connection modes by flat cables.

FIG. 2 shows a part of the rear face 26 of the liquid crystal module 20. Also, the same Figure illustrates the side surface 25 above the rear face 26. In this embodiment, the control substrate 23 is arranged in the vicinity of an upper long side 27 of the liquid crystal module 20 with a substantially center of the control substrate being located on a vertical center-line (a chine line) of the liquid crystal module 20. Four connectors 23a, 23b, 23c, and 23d used for connection to the drive circuit substrates 24a, 24b are in turn attached to the control substrate 23 from the left (from the left of the left and right as viewed from the rear side of the liquid crystal television 100, hereinafter similarly referred to as "the-left"). The connectors 23a, 23b, 23c, 23d are attached to the control substrate 23 with the connectors 23b, 23c interposing the above-mentioned vertical center-line therebetween. Also, the connectors 23a to 23d are mounted to the control substrate 23 in a condition where they are all directed upward of the liquid crystal module 20. The connectors 23a to 23d correspond to first connectors and first cable connecting sections.

On the other hand, the drive circuit substrates 24a, 24b are provided on the side surface 25 so as to be spaced apart from each other at a predetermined interval and disposed in left and right areas of the side surface 25 which interpose the above-mentioned vertical center-line therebetween. To the left drive circuit substrate 24a, two connectors used for connection to the control substrate 23, namely, connectors 24a1 and 24a2 are in turn attached from the left. To the right drive circuit substrate 24b, two connectors used for connection to the control substrate 23, namely, connectors 24b1 and 24b2 are in turn attached from the left. The connectors 24a1, 24a2, 24b1, 24b2 are mounted to the drive circuit substrates in a condition where they are all directed toward the rear face of the liquid crystal module 20. The connectors 24a1, 24a2, 24b1, 24b2 correspond to second connectors and second cable connecting sections.

In the construction as discussed above, a set of the connector 23a and the connector 24a1, a set of the connector 23b and the connector 24a2, a set of the connector 23c and the connector 24b1, and a set of the connector 23d and the connector 24b2 are connected by a flat cable 30a, a flat cable 30b, a flat cable 30c, and a flat cable 30d, respectively.

In this embodiment, from the viewpoint of reduction in the production cost of the liquid crystal television 100, effective usage of a space of the rear face 26 of the liquid crystal module 20 and the like, the control substrate 23 is miniaturized as compared to the conventional control substrate. Concretely, a width of the control substrate 23 which is measured in the left and right directions of the control substrate 23 is reduced. In FIG. 2, a width of the control substrate 23 which is measured in the left and right directions before the control substrate 23 is miniaturized is shown by chain double-dashed lines. Respective intervals between adjacent connectors of the four connectors 23a, 23b, 23c, 23d attached to the control substrate 23 are also reduced as compared to the conventional connectors. That is, the four connectors 23a to 23d occupy positions adjacent the vertical center-line as compared to the conventional connectors. On the other hand, the side surface 25 on which the drive circuit substrates 24a, 24b are installed is a very narrow area and, if a positional relationship between the side surface 25 and components other than the drive circuit substrates 24a, 24b is taken into account, it is hard to change the sizes and installation locations of the drive circuit substrates 24a, 24b.

Therefore, the control substrate 23, is miniaturized as discussed above, resulting in a left and right directional extent of the installation locations of the connectors 24a1, 24a2, 24b1, 24b2 of the drive circuit substrates 24a, 24b being widened as compared to a left and right directional extent of the installation locations of the connectors 23a to 23d of the control substrate 23. Concretely, a space between the connectors 24a2, 24b1 is wider than a space between the connectors 23b, 23c, and a space between the connectors 24a1, 24b2 is wider than a space between the connectors 23a, 23d. Consequently, the connectors which are to be connected to each other by the single flat cable 30 are located at positions which are shifted from an elongation line of a counter connector along a surface of the liquid crystal module 20. For this reason, in this embodiment, the flat cables 30a to 30d are bent as shown in FIG. 2, whereby the connection between the connectors which are not opposed to each other on the elongation line of the counter connector on the surface of the liquid crystal module 20 is made.

That is, the flat cable 30a connecting the connector 23a and the connector 24a1, and the flat cable 30b connecting the connector 23b and the connector 24a2 are firstly bent toward the left side one time in such a manner that surface regions of the cables are overlapped with each other in the middles of the cables led out from the control substrate 23, and then further bent upward one time in such a manner that surface regions of the cables are overlapped with each other at predetermined regions of the firstly bent cable portions. As a result, it is possible to connect the connectors 23a, 23b and the connectors 24a1, 24a2 located on the left side as compared to the connectors 23a, 23b.

Moreover, the flat cable 30c connecting the connector 23c and the connector 24b1, and the flat cable 30d connecting the connector 23d and the connector 24b2 are firstly bent toward the right side one time in such a manner that surface regions of the cables are overlapped with each other in the middles of the cables led out from the control substrate 23, and then further bent upward one time in such a manner that surface regions of the cables are overlapped with each other at predetermined regions of the firstly bent cable portions of the flat cables 30c, 30d. As a result, it is possible to connect the connectors 23c, 23d and the connectors 24b1, 24b2 located on the right side as compared to the connectors 23c, 23d.

Among the four flat cables 30a to 30d making the connection between the substrates as discussed above, the two inner flat cables 30b, 30c are to be used for supplying the above-mentioned RGB signal to the drive circuit substrates 24a, 24b from the control substrate 23, and the two outer flat cables 30a, 30d are to be used for supplying power to the drive circuit substrates 24a, 24b from the control substrate 23.

The connection-mode for connection between the substrates by the flat cables is not limited to the above-mentioned example.

Figure 3:
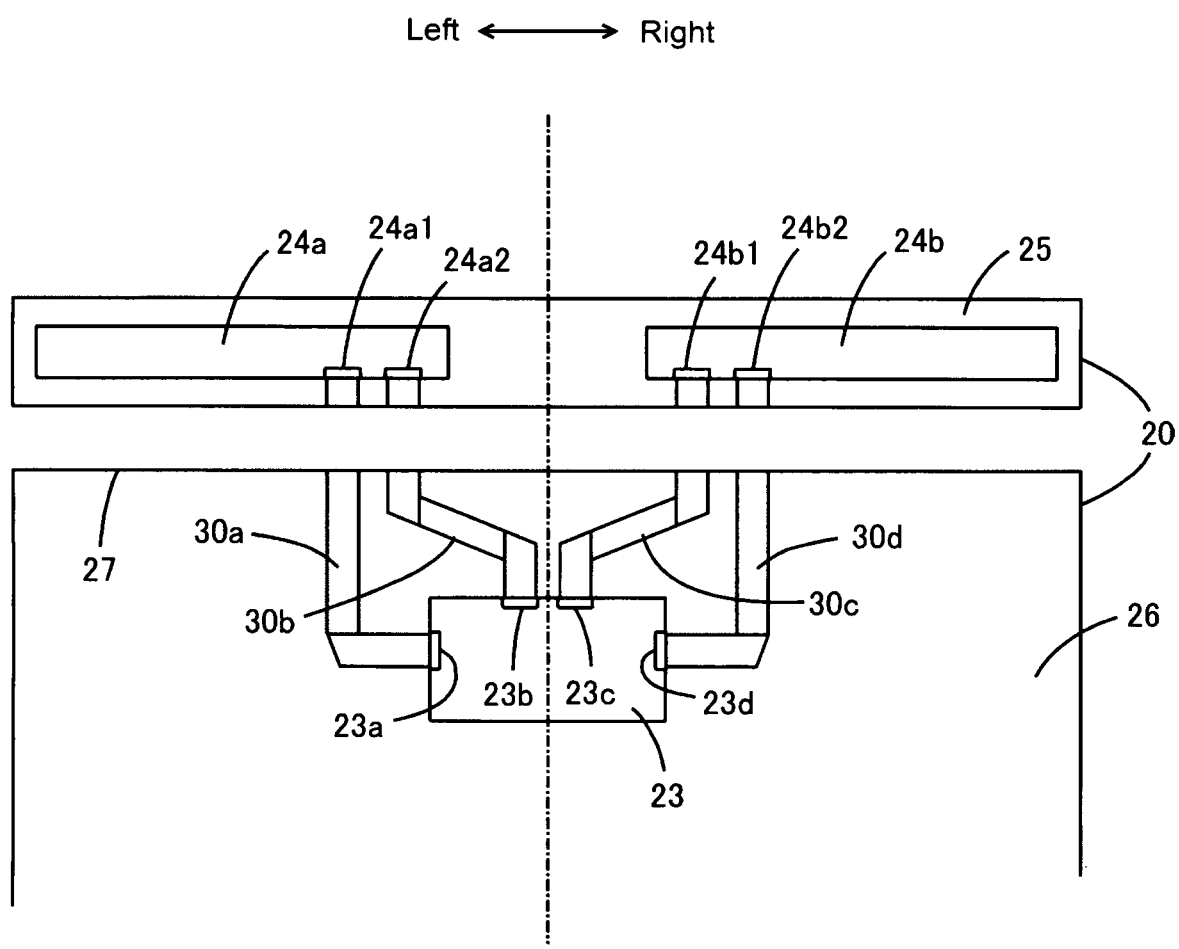
FIG. 3 is a schematic view illustrating another example of the connection modes by the flat cables.
Figure 4:
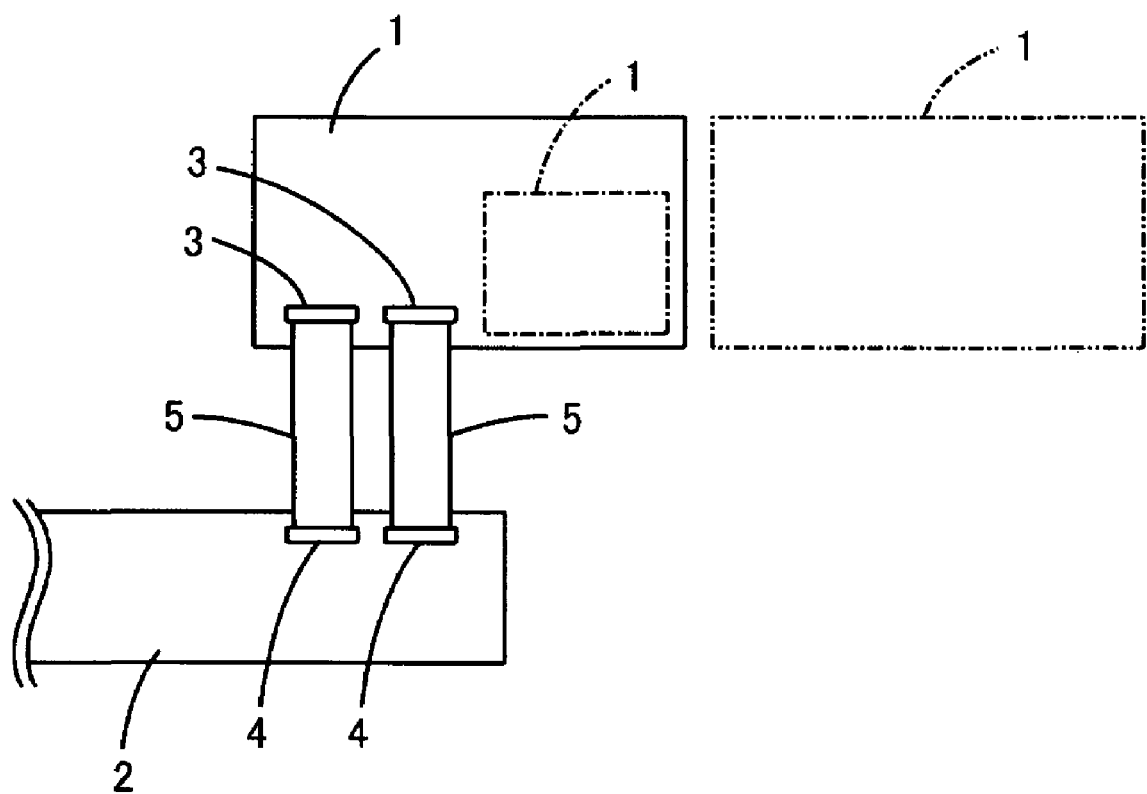
FIG. 4 is a schematic view illustrating a conventional connection mode by flat cables.

FIG. 3 illustrates another example of the connection mode by the flat cables. In the example shown in the same Figure, in order to facilitate further miniaturizing of the control substrate 23, among the connectors 23a to 23d, the connector 23a and the connector 23d are attached to the left side and right side of the control substrate 23, respectively, so as to face outward in the left and right directions. The flat cable 30a led out in the left direction from the connector 23a is bent upward at substantially right angles one time in such a manner that surface regions of the flat cable 30a are overlapped with each other in the middle of the flat cable 30. On the other hand, the flat cable 30d led out in the right direction from the connector 23d is bent upward at substantially right angles one time in such a manner that surface regions of the flat cable 30d are overlapped with each other in the middle of the flat cable 30d. By causing the flat cables 30a, 30d to be bent in this manner, it is possible to connect the connector 23a and the connector 24a1 located outward on the left side as compared to the connector 23a, and it is also possible to connect the connector 23d and the connector 24b2 located outward on the right side as compared to the connector 23d.

According to the present invention, in the case where the control substrate 23 installed on the rear face 26 of the liquid crystal module 20 is to be connected to the two drive circuit substrates 24a, 24b installed at the left and right areas of the upper side surface 25 of the liquid crystal module 20, the respective flat cables 30 for connecting the substrates are bent in such a manner that the surface regions thereof are overlapped with each other in the middles of the cables, to thereby cause the elongation directions of the respective flat cables to be shifted substantially parallel, or bent at the substantially right angles. Therefore, the connectors of the substrates which are to be connected by the single flat cable 30 and present at the positions shifting from the elongation line can be connected to each other by the flat cable 30. As a result, the degree of freedom in the installation locations of the connectors on the substrates can be increased, and it is easy to realize the miniaturization of the control substrate 23. The miniaturization of the control substrate 23 contributes to reduction in the production cost of the liquid crystal television 100.

Moreover, by improving the degree of freedom in change of the locations of the connectors, the installation location of the control substrate 23 with respect to the rear face 26 can be also freely selected, thus making it possible to effectively use a rear space of the liquid crystal module 20.

Moreover, in the case where the control substrate 23 is miniaturized and the installation location of the control substrate 23 is changed, it is unnecessary to carry out work in which the drive circuit substrates 24a, 24b are large-sized and the installation locations of the drive circuit substrates 24a, 24b are changed, so that cost for such work as hitherto required to be carried out at the time of the production of the liquid crystal television can be saved.

While the invention has been particularly shown and described with respect to preferred embodiments thereof, it should be understood by those skilled in the art that the foregoing and other changes in form and detail may be made therein without departing from the spirit and scope of the invention as defined in the appended claims.

What is claimed is:

1. A liquid crystal television comprising:
   a liquid crystal module having a front face, a rear face and side surfaces interconnecting the front face and the rear face; and
   a television cabinet having the liquid crystal module housed therein, the liquid crystal module comprising:
   a device including a liquid crystal panel whose screen size is larger than 27 inch, and a backlight unit installed on a rear face of the liquid crystal panel;
   the liquid crystal panel having a plurality of vertically facing signal electrodes provided therein;
   a control substrate installed on a rear face of the backlight unit for demodulating an image signal on the basis of a television broadcast signal, producing an RGB signal per pixel of the liquid crystal television on the basis of the demodulated image signal, and carrying out control of a supply of power;
   two drive circuit substrates installed at predetermined positions of the device for receiving the RGB signal and the supply of power from the control substrate, to thereby drive the plurality of vertically facing signal electrodes;
   first four connectors mounted to the control substrate;
   second four connectors mounted to the drive circuit substrates; and
   flat cables connecting the first connectors and the second connectors,
   the control substrate is arranged in a vicinity of a long side of an upper side surface of the liquid crystal module with a substantially center of the control substrate located on a vertical center-line of the liquid crystal module,
   the first four connectors are mounted to the control substrate oriented toward the long side and two of the first four connectors are arranged at each of left and right sides interposing the vertical center-line,
   two of the second four connectors are mounted to each of the drive circuit substrates oriented toward the rear face of the liquid crystal module,
   the two drive circuit substrates are respectively arranged on left and right areas of the upper side surface so as to interpose the vertical center-line therebetween,
   two inner connectors of the second four connectors that interpose the vertical center-line are mounted to the drive circuit substrates in a condition where an interval between the two inner connectors becomes longer than an interval between two inner connectors of the first four connectors,
   two outer connectors of the second four connectors are mounted to the drive circuit substrates in a condition where an interval between the two outer connectors becomes longer than an interval between two outer connectors of the first four connectors,
   connection between the first connectors and the second connectors that are located on a right side of the vertical center-line is made by bending flat cables that are led from the first connectors to the right side once such that cable surface regions thereof are overlapped with each other, and bending the cables upward once such that cable surface regions thereof are overlapped with each other,
   connection between the first connectors and the second connectors that are located on a left side of the vertical center-line is made by bending flat cables that are led from the first connectors to the left side once such that cable surface regions thereof are overlapped with each other, and bending the cables upward once such that cable surface regions thereof are overlapped with each other,
   two flat cables connecting the first inner connectors and the second inner connectors are used for supplying the RGB signal to each of the drive circuit substrates from the control substrate, and
   two flat cables connecting the first outer connectors and the second outer connectors are used for supplying power to each of the drive circuit substrates from the control substrate.

2. A panel-type display device comprising:
   a device body having a display panel on a side of a front face thereof;
   a first substrate installed on a rear face of the device body;
   second substrates installed at predetermined positions of the device body;
   flat cables connecting the first substrate and the second substrates;
   first cable connecting sections provided at the first substrate; and
   second cable connecting sections provided at the second substrates and arranged at locations shifting from elongation lines of flat cables led out from the first cable connecting sections so as to extend along a surface of the device body,
   the flat cables led out from the first cable connecting sections are bent such that cable surface regions thereof are overlapped with each other in the middles of the flat cables, and the first cable connecting sections and the second cable connecting sections are connected by the flat cable led out from the first cable connecting sections.

3. A panel-type display device according to claim 2, wherein the flat cables are led out from the first cable connecting sections and the second cable connecting sections so as to extend along the surface of the device body, the first cable connecting sections and the second cable connecting sections are provided so as to allow the flat cables to extend substantially parallel to one another, and the first cable connecting sections and the second cable connecting sections are connected by the flat cables which are bent at two portions thereof in the middles thereof.

4. A panel-type display device according to claim 2, wherein the flat cables are led out from the first cable connecting sections and the second cable connecting sections so as to extend along the surface of the device body, the first cable connecting sections and the second cable connecting sections are provided so as to allow the flat cables to cross at substantially right angles, and the first cable connecting sections and the second cable connecting sections are connected by the flat cables which are bent at substantially right angles at a portion thereof in the middle thereof.

5. A panel-type display device according to claim 2, wherein the second substrates are respectively installed on both sides of one of side surfaces interconnecting the front and rear faces of the device body, the both sides interposing a substantially center area of the side surface therebetween.

6. A panel-type display device according to claim 5, wherein the second substrates are respectively installed on both sides of an upward facing surface of the side surfaces interconnecting the front and rear faces of the device body, the both sides interposing a substantially center area of the upward facing surface, and the second cable connecting sections are provided at the second substrates so as to face the rear face of the device body.

7. A panel-type display device according to claim 2, wherein the first substrate is installed in the vicinity of an upper long side of the rear face of the device body in a condition where a substantially center of the first substrate is located on a vertical center-line of the device body.

* * * * *